(12) United States Patent
Kihara

(10) Patent No.: US 8,067,820 B2
(45) Date of Patent: Nov. 29, 2011

(54) SILOCON WAFER SUPPORTING METHOD, HEAT TREATMENT JIG AND HEAT-TREATED WAFER

(75) Inventor: Takayuki Kihara, Tokyo (JP)

(73) Assignee: Sumco Corporation, Tokyo (JP)

( * ) Notice: Subject to any disclaimer, the term of this patent is extended or adjusted under 35 U.S.C. 154(b) by 194 days.

(21) Appl. No.: 12/311,833

(22) PCT Filed: Oct. 15, 2007

(86) PCT No.: PCT/JP2007/070060
§ 371 (c)(1),
(2), (4) Date: Apr. 15, 2009

(87) PCT Pub. No.: WO2008/047752
PCT Pub. Date: Apr. 24, 2008

(65) Prior Publication Data
US 2010/0200962 A1    Aug. 12, 2010

(30) Foreign Application Priority Data
Oct. 16, 2006 (JP) .................................. 2006-281868

(51) Int. Cl.
| | |
|---|---|
| H01L 29/04 | (2006.01) |
| B05C 13/00 | (2006.01) |
| B05C 13/02 | (2006.01) |
| B05C 21/00 | (2006.01) |
| A47G 19/08 | (2006.01) |
| F27D 5/00 | (2006.01) |

(52) U.S. Cl. .................. 257/627; 257/620; 257/E31.04; 257/E21.345; 118/500; 211/41.18; 432/253

(58) Field of Classification Search .................. 118/500; 211/41.18; 432/253; 257/620, 627, E31.04, 257/E21.345
See application file for complete search history.

(56) References Cited

U.S. PATENT DOCUMENTS

| | | | |
|---|---|---|---|
| 5,492,229 A * | 2/1996 | Tanaka et al. | 211/41.18 |
| 5,507,873 A * | 4/1996 | Ishizuka et al. | 118/728 |
| 5,711,808 A * | 1/1998 | Yang et al. | 118/500 |
| 5,779,797 A * | 7/1998 | Kitano | 118/500 |
| 6,361,313 B1 * | 3/2002 | Beyaert et al. | 432/259 |

(Continued)

FOREIGN PATENT DOCUMENTS

| | | |
|---|---|---|
| JP | 08-181083 | 7/1996 |
| JP | 09-139352 | 5/1997 |
| JP | 11-054598 | 2/1999 |
| JP | 2003-173971 | 6/2003 |
| WO | 00/19502 | 4/2000 |

*Primary Examiner* — Minh-Loan T Tran
*Assistant Examiner* — Teresa M Arroyo
(74) *Attorney, Agent, or Firm* — Clark & Brody

(57) ABSTRACT

Provided is a method applicable to the production of silicon wafers having crystal orientation <100> or <110> and consisting in specifying wafer-supporting positions on the occasion of heat treatment in a vertical heat treatment furnace as well as a heat treatment jig for use in carrying out that method. It becomes possible to suppress the shear stress which contributes to the extension of the slip generated at each wafer-supporting element contact point as an initiation, suppress slip growth and thus markedly improve the yield of heat-treated silicon wafers. The heat-treated wafer obtained by using the supporting method and the heat treatment jig has few slip, in particular has no long and large slip, and is high in quality.

2 Claims, 6 Drawing Sheets

U.S. PATENT DOCUMENTS

| | | |
|---|---|---|
| 6,799,940 B2 * | 10/2004 | Joe et al. .................... 414/672 |
| 7,033,168 B1 * | 4/2006 | Gupta et al. ................. 432/253 |
| 7,055,702 B1 * | 6/2006 | Buckley ..................... 211/41.18 |
| 7,256,375 B2 * | 8/2007 | Oosterlaken ................. 219/634 |
| 2003/0150386 A1 * | 8/2003 | Shimada ....................... 118/728 |
| 2004/0109748 A1 * | 6/2004 | Joe et al. .................. 414/416.01 |
| 2006/0131696 A1 * | 6/2006 | Arikado et al. .............. 257/618 |
| 2006/0208434 A1 * | 9/2006 | Nakada et al. ................ 279/128 |

* cited by examiner

Fig.7
(a)
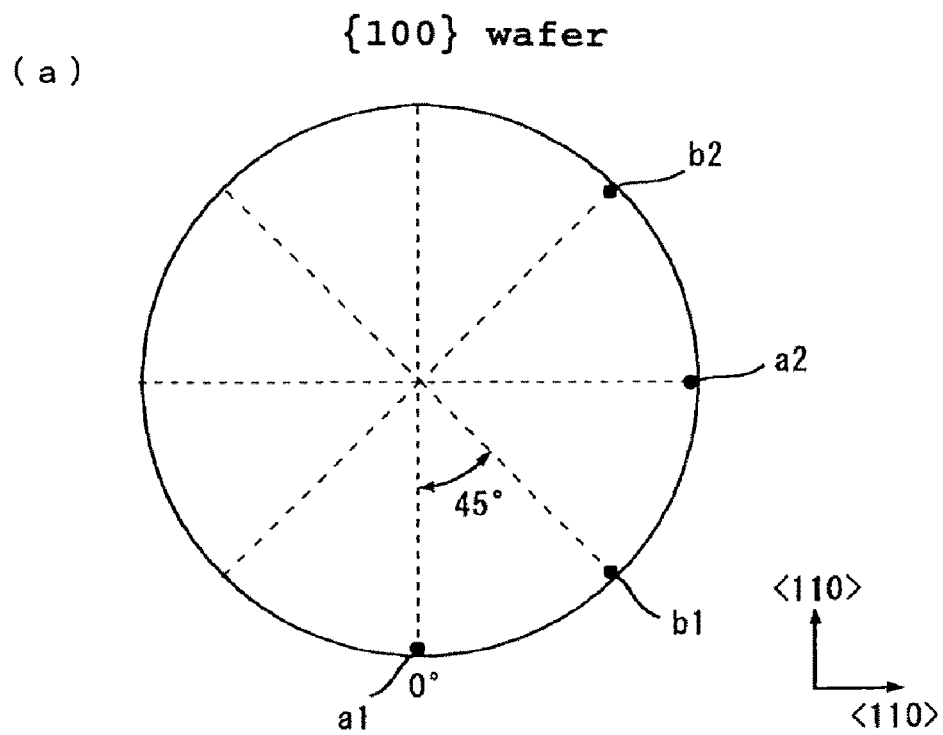
(b)
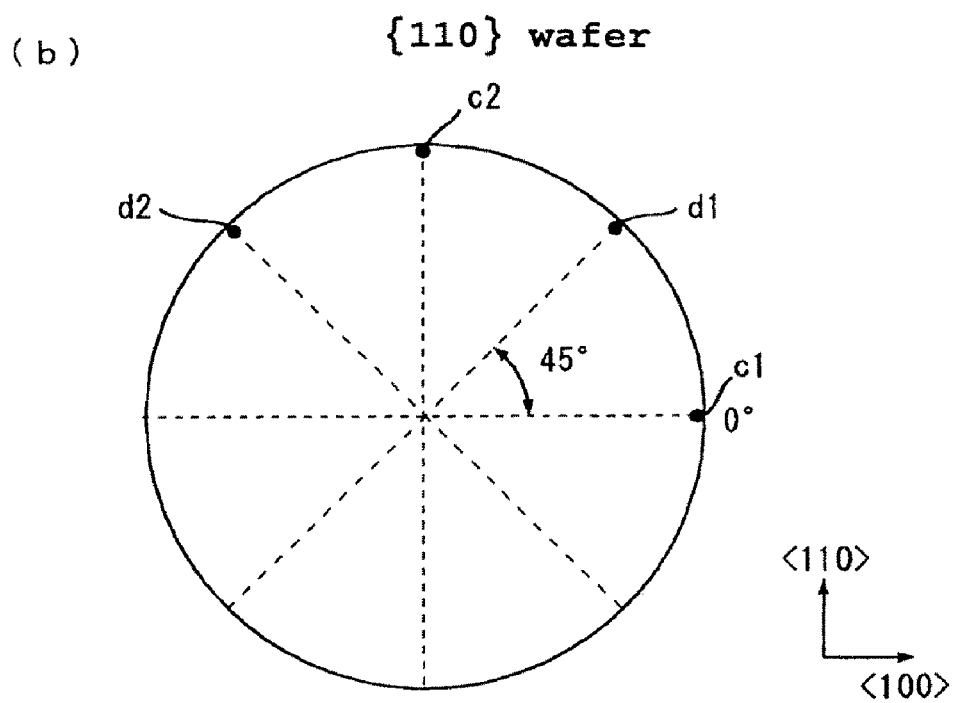

SILOCON WAFER SUPPORTING METHOD, HEAT TREATMENT JIG AND HEAT-TREATED WAFER

TECHNICAL FIELD

The present invention relates to a method of supporting a silicon wafer on the back side thereof on the occasion of heat treatment thereof, a heat treatment jig for heat treatment of a silicon wafer, and a heat-treated wafer obtained by heat treatment.

BACKGROUND ART

In the process for silicon wafer production, there are a number of steps in which silicon wafers directly contacted and supported on their back sides by a supporting member are subjected to heat treatment. For example, a heat treatment step using a vertical boat, an RTA (rapid thermal annealing) step, a single-feed type epitaxial growth step and an SOI heat treatment step are relevant, and in such many heat treatments, silicon wafers directly contacted and supported on their back sides by a supporting member are subjected to various processes.

For example, in the heat treatment of silicon wafers in a vertical batch-wise heat treatment furnace, use is made of a wafer supporter (hereinafter referred to as "supporting boat"), as shown in FIG. 1, which supports each wafer at three or four points in an outer peripheral portion on the back of the wafer. Thus, the supporting boat 1 comprises three or four columns 3, a top end plate 5 and a bottom end plate 6 that respectively are attached to the upper and lower ends of the columns 3, and a sideways opening 2. Each of the columns 3 has a row of wafer-supporting elements 4 and, after placing silicon wafers on such supporting elements 4 through the sideways opening 2, the whole boat is inserted into a vertical heat treatment furnace for each intended heat treatment.

However, when silicon wafers are placed on such supporting boat and subjected to heat treatment, a problem is encountered; namely, crystal defects called slip initiating from the damage incurred at the point of contact between the wafer and each supporting element surface may appear in each silicon wafer, and such slip grows and develops under the influence of the thermal stress caused during heat treatment, with the result that a wafer yield is decreased. In the case of wafers having a diameter of 300 mm or larger, such slip growth and extension may also be caused by the stress resulting from the wafer's own weight (gravity stress).

As a means for solving such problem, there is known a wafer supporting jig in which an area of contact between each wafer and each supporting element is widened so that the load incurred by the wafer's own weight may be dispersed and the gravity stress may be reduced as much as possible.

However, a groove (corresponding to a gap between surfaces of two neighboring wafer supporting elements 4 in the supporting boat shown in FIG. 1) in this supporting jig should have different machining accuracy or induce different contact surface conditions (flatness and surface roughness) and, for some grooves, the stress incurred by wafer's own weight may not be dispersed all over the contact surface but may be concentrated at a specific position, for example single point, and this contact point may act as an initiation point for slip generation.

For avoiding the state such that the contact point may act as an initiation point for slip generation in the wafer supporting jig, control is made so that each wafer may come into contact with the whole relevant surface of each supporting element at each groove; however, this is actually difficult. Thus, the supporting jig having an increased wafer-supporting contact area cannot be said to exhibit a satisfactory slip inhibiting effect.

On the other hand, it is known with regard to silicon crystals that the stress contributing to slip extension varies depending on the crystal orientation. Japanese Patent Application Publication (Kokai) No. Hei 09-139352 discloses an invention concerning a wafer boat for a vertical furnace by which stress generation by wafer's own weight can be reduced; in this document, the calculation of critical shear stresses upon application of a predetermined thermal stress to a silicon wafer are made for twelve crystal slip systems governing slip generation in silicon wafers.

According to those results, along the crystal orientations <110> and <100>, slip generation hardly occurs, and it is concluded that the slip generation can be suppressed by supporting the wafer having crystalline (001) face in a direction of the crystal orientation <100> or <110> on its back side.

However, even if this technology is utilized to suppress slip generation, it is difficult to suppress slip growth using the above-mentioned wafer supporting jig having an increased wafer-supporting contact area in the support since the crystal orientation varies according to directions on the wafer surface and the stress (shear stress) contributing to slip extension varies accordingly and the wafer-supporting element contact point which acts as an initiation point for the slip cannot be singled out.

This problem of slip generation is not limited to a vertical batch-wise heat treatment furnace but common to processes in which wafers locally supported on their back sides are subjected to heat treatment, for example in a single-feed type heat treatment furnace or epitaxial growth treatment furnace.

DISCLOSURE OF INVENTION

As mentioned above, heat treatment of a silicon wafer supported on the back side thereof may result in slip generation in the silicon wafer as the wafer-supporting element contact point serves as an initiation point, followed by slip growth and extension under the influence of the thermal stress, among others, during the heat treatment, with the result that a wafer yield is reduced; it is difficult to effectively prevent this problems.

The present invention has been made to solve such problems as mentioned above, and an object thereof is to provide (a) a method of supporting a silicon wafer with the crystal orientation <100> or <110>, according to which the wafer-supporting positions are specified to minimize the stress (shear stress) contributing to slip extension and to suppress slip growth, thereby markedly improving a silicon wafer yield in heat treatment, (b) a heat treatment jig to be used in carrying out such method, and (c) a high quality heat-treated wafer obtained by such method and with such jig.

The present inventor made investigations to accomplish the above object. As a result, the inventor found that shear stress contributing to slip extension greatly varies according to positions in a circumferential direction in a silicon wafer with crystal orientation <110> or <100> and that the shear stress can be suppressed to a low level and slip growth and extension can be suppressed when each wafer-supporting position (supporting area) is adequately specified.

These findings have now led to completion of the present invention, which consists in (1) a method of supporting silicon wafers, (2) a heat treatment jig and (3) heat-treated wafers, respectively mentioned below.

(1) A method of supporting a silicon wafer having crystal plane {100} on its main surface (hereinafter, simply referred to as "silicon wafer having crystal orientation <100>" or "<100> wafer") or a silicon wafer having crystal plane {110} on its main surface (hereinafter, simply referred to as "silicon wafer having crystal orientation <110>" or "<110> wafer") for heat treatment thereof, is characterized in that: (i) in the case of the <110> wafer, the silicon wafer back side is supported (a) in "a fan-shaped region of wafer surface in the range of 40° to 60° relative to the reference direction in parallel to the silicon wafer surface" (datum region), the reference direction being from the center of the silicon wafer toward <100>, and (b) in other regions of wafer surface which are determined by rotations of the datum region by 90° each time; and (ii) in the case of the <100> wafer, the silicon wafer back side is supported (a) in "a fan-shaped region of wafer surface region in the range of 40° to 60° relative to the reference direction" (datum region), the reference direction being toward <110> and (b) in other regions of wafer surface which are determined by rotations of the datum region by 90° each time.

The term "fan-shaped region of wafer surface in the range of 40° to 60°" as used herein means a fan-shaped region defined by (a) a radial line segment in a direction of the above-defined angle of 40°, (b) a radial line segment in a direction of the above-defined angle of 60°, both being connected with the center of the wafer as the vertex of the fan, and (c) a wafer circumference portion as an arc portion of the fan between the two radial line segments. This fan-shaped region of wafer surface constitutes a datum region/part of the wafer-supporting positions. The range of "40° to 60°" may be settled either in the positive direction (the counterclockwise direction being referred to herein as "positive direction") or in the reverse direction with respect to the above the reference direction.

The above-mentioned "other regions of wafer surface which are determined by rotations of the datum region by 90° each time" indicate other positions for supporting the wafer. Thus, those supporting positions are in the fan-shaped regions of wafer surface resulting from rotations (shifts) of the datum region mentioned above by 90° each time in a circumferential direction. Since rotations are made each time by 90° (in other words, shifts are made each time by 90° in the positive direction or in the reverse direction), four-times shifts, for instance, of the datum region, the fan-shaped region in the range of 40° to 60°, either in the positive direction or in the reverse direction should cause the fourth rotated region to overlap the datum region, the first 40°-60° fan-shape region. Thus, there are four wafer-supporting candidate locations (areas) where the shear stress contributing to slip extension can be suppressed to a low level. In carrying out the supporting method of the invention, the wafer is generally supported in three areas out of four of these.

(2) A silicon wafer heat treatment jig which is configured so as to support a silicon wafer having crystal orientation <100> or a silicon wafer having crystal orientation <110> on the back side thereof, is characterized in that: (i) in the case of the <110> wafer, the jig comprises a supporting member for supporting the silicon wafer (a) in "a fan-shaped region of wafer surface in the range of 40° to 60° relative to the reference direction in parallel to the silicon wafer surface" (datum region), the reference direction being from the center of the silicon wafer toward a direction <100>, and (b) in other regions of wafer surface which are determined by rotations of the datum region by 90° each time; and (ii) in the case of the <100> wafer, the jig comprises a supporting member for supporting the silicon wafer (a) in "a fan-shaped region of wafer surface in the range of 40° to 60° relative to the reference direction" (datum region), the reference direction being toward <110> and (b) in other regions of wafer surface which are determined by rotations of the datum region by 90° each time.

(3) A heat-treated silicon wafer having crystal orientation <100> or a heat-treated silicon wafer having crystal orientation of <110>, is characterized in that: (i) in the case of the <110> wafer, the wafer is heat-treated as being supported (a) in "a fan-shaped region thereof in the range of 40° to 60° relative to the reference direction in parallel to the silicon wafer surface" (datum region), the reference direction being from the center of the silicon wafer toward <100>, and (b) in other regions of wafer surface which are determined by rotations of the datum region by 90° each time; and (ii) in the case of the <100> wafer, the wafer is heat-treated as being supported (a) in "a fan-shaped region of wafer surface in the range of 40° to 60° relative to the reference direction" (datum region), the reference direction being toward <110> and (b) in other regions of wafer surface which are determined by rotations of the datum region by 90° each time.

According to the silicon wafer supporting method of the invention, it is possible, in heat treatment of a silicon wafer having crystal orientation <100> or <110> which is supported on the back side thereof, to reduce the stress (shear stress) contributing to slip extension and suppress slip growth and thereby markedly improve a heat-treated silicon wafer yield.

Further, this supporting method can be carried with ease using the silicon wafer heat treatment jig of the invention and can provide the high quality silicon wafer of the invention as having few slip and, in particular, having no long and large slip.

BRIEF DESCRIPTION OF THE DRAWINGS

FIG. 7 shows positions which turn to slip initiating points in the silicon wafer as employed in the examples. FIG. 7(*a*) is for the case of a wafer having crystal orientation <100> and FIG. 7(*b*) is for the case of a wafer having crystal orientation <110>.

BEST MODES FOR CARRYING OUT THE INVENTION

Figure 1:
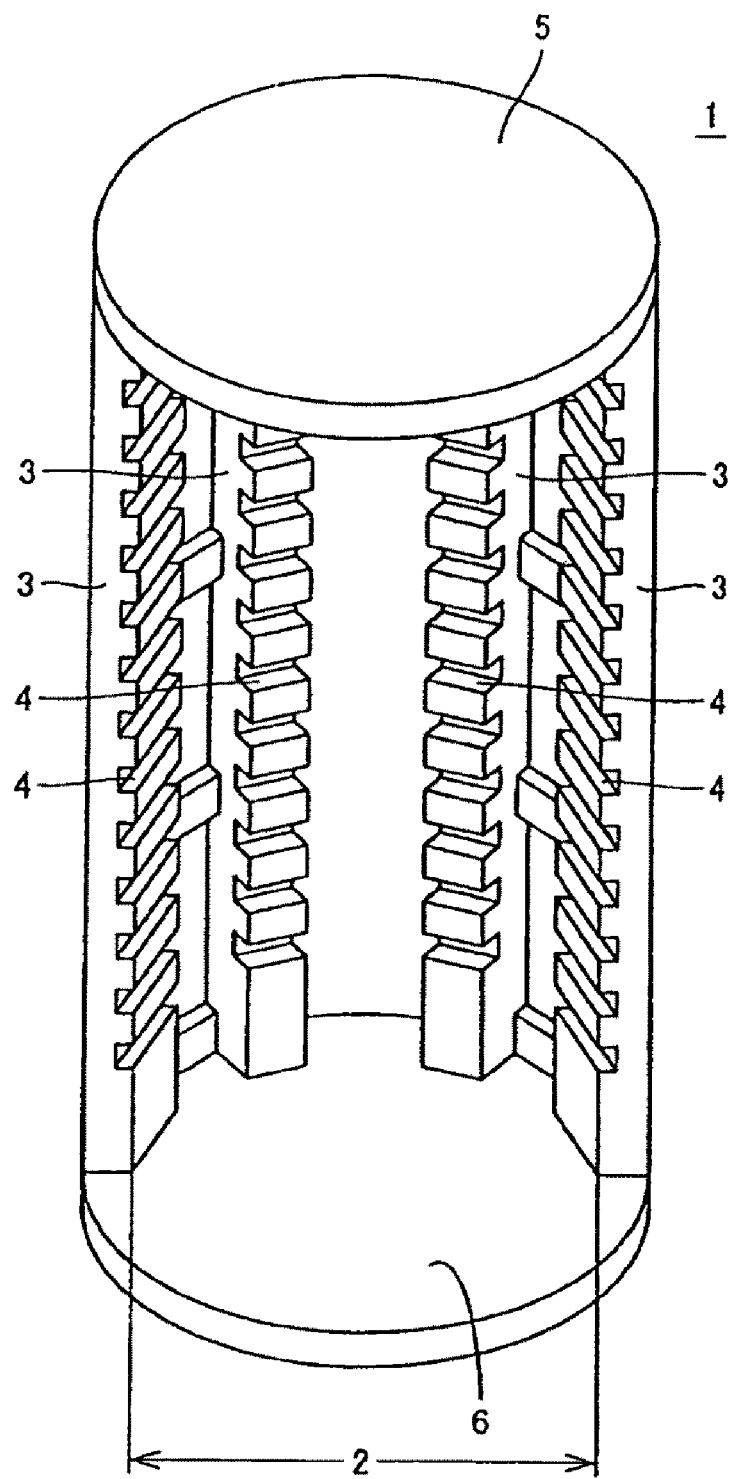
FIG. 1 shows an example of configuration of a semiconductor silicon substrate-supporting boat for use in a vertical heat treatment furnace.

In the following, the silicon wafer-supporting method, the heat treatment jig and the heat-treated wafer obtained thereby and therewith, each according to the present invention, are described in more specifically.

The silicon wafer-supporting method of the invention is, as mentioned above, a method of supporting a silicon wafer having crystal orientation of <100> or a silicon wafer having crystal orientation of <110> for heat treatment thereof and is characterized in that: (i) in the case of the <110> wafer, the silicon wafer's backside is supported (a) in "a fan-shaped region of wafer surface in the range of 40° to 60° relative to the reference direction in parallel to the silicon wafer surface" (datum region), the reference direction being from the center of the silicon wafer toward <100>, and (b) in other regions of wafer surface which are determined by rotations of the datum region by 90° each time; and (ii) in the case of the <100> wafer, the silicon wafer back side is supported (a) in "a fan-shaped region of wafer surface in the range of 40° to 60° relative to the reference direction" (datum region), the reference direction being toward <110> and (b) in other regions of wafer surface which are determined by rotations of the datum region by 90° each time.

In carrying out this silicon wafer-supporting method, the heat treatment encompasses a heat treatment using a vertical heat treatment boat, an RTA treatment by which the heat treatment duration time can be markedly reduced, a single-feed type epitaxial growth and an SOI heat treatment, among others. In these treatment steps, the heat treatment is carried out in a state such that the silicon wafer's back side is directly contacted and supported by a supporting member and, when the wafer is supported near the edge portions thereof by the supporting elements, for instance, in comparing the wafer center vicinity with the edge vicinity a temperature difference $\Delta T$ ($\Delta T=|Tc-Te|$, where Tc denotes the wafer center temperature and Te denotes the wafer edge temperature), is unavoidably generated in the wafer plane due to the difference in the thermal energy given by radiation from the furnace wall, in particular during raising or lowering temperature in heat treatment.

This temperature difference $\Delta T$ causes thermal stress, which contributes to slip growth and extension occurring in the wafer at the wafer-supporting element contact points. Thus, the stress acts as a driving force for slip growth and extension. This thermal stress varies as the temperature difference $\Delta T$ in the wafer plane varies in response to the gap difference between neighboring wafers placed on wafer-supporting elements in the furnace and to variations in temperature raising or lowering rate.

The thermal stress thus produced in the silicon wafer on the occasion of heat treatment acts as shear stress which causes slip growth and extension and causes scooting deformation (shearing deformation), and this shear stress varies greatly depending on positions in a wafer circumferential direction, as described later herein.

The slip generated in a silicon wafer as mentioned above moves on a silicon crystal (111) face in three [110] directions. A silicon crystal has four equivalent (111) faces, so that a total of twelve slip systems can be considered. However, they can be categorized into a certain number of slip systems. The number of slip systems thus categorized varies depending on wafer crystal orientations; in the case of a silicon wafer having face orientation <100>, for instance, it is only necessary to take into consideration five slip systems, namely resolved shear stresses in five directions (stress resolved in a respective slip direction on a slip plane).

Therefore, first, a principal stress component in a wafer plane was determined by a finite element method and then resolved in slip directions, and resolved shear stresses in respective directions of slip extension were thus calculated.

Figure 2:
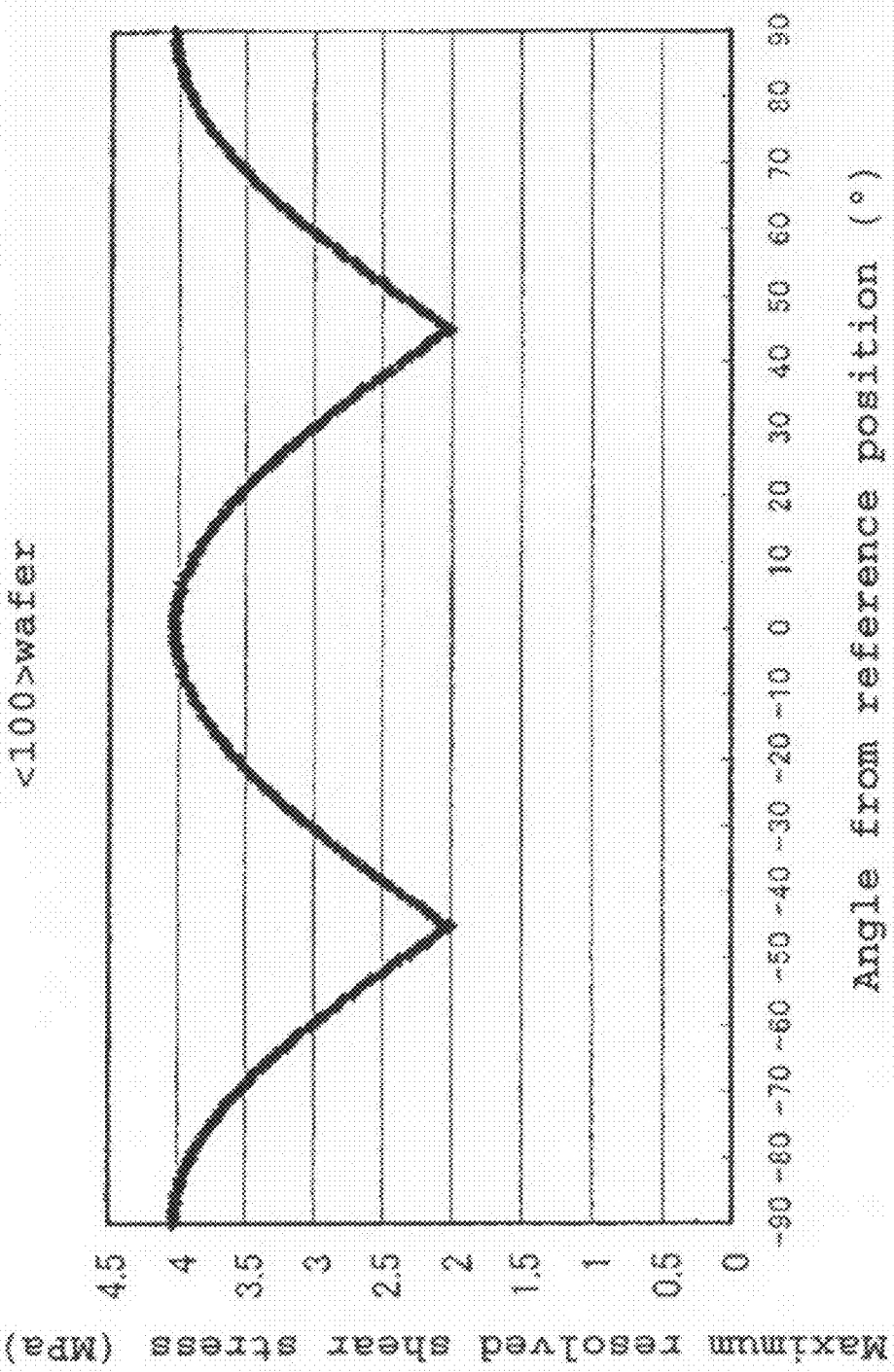
FIG. 2 shows maximum resolved shear stresses in different positions on the wafer circumference for a silicon wafer having a diameter of 300 mm and crystal orientation <100>.

The data shown in FIG. 2 were obtained by subjecting a silicon wafer having a diameter of 300 mm and crystal orientation of <100> to heat treatment and determining, by the finite element method, a maximum resolved shear stress on each point of the wafer circumference during raising temperature. As mentioned above, the resolved shear stresses are stresses resolved in slip directions on the slip plane at the time that the slip is generated, so that in the figure, the value calculated is referred to as "maximum resolved shear stress" and this means the value obtained as a result of combination of several resolved shear stresses respectively acting in a predetermined position in the vicinity of the circumference of the silicon wafer having crystal orientation <100>.

In FIG. 2, the abscissa denotes the position on the wafer circumference as expressed in terms of angle (°) relative to the reference direction which defined as being from the center of the wafer toward <110> in parallel to the silicon wafer surface. The angle 0° indicates the circumference position (reference position) where the reference direction as being from the wafer center toward <110> intersects the wafer circumference. When the wafer is placed horizontally in a manner such that the position 0° (reference position) is set on the near side, namely at 6 o'clock position in case of a top view, the position 90° indicates the right-hand side edge (3 o'clock) position on the wafer circumference and the position −90° indicates the left-hand side edge (9 o'clock) position on the wafer circumference.

As shown in FIG. 2, the maximum resolved shear stress gets to a relative maximum at the position 0° (reference position) and gets to a relative minimum in the position away by 45° from the reference position. The relative minimum stress is about half of the stress at the position 0°. While, in the figure, data are shown for the semicircle (−90° to 90°) of the wafer, the same is true in the other semicircle; the positions (angles) of the relative maximum resolved shear stress and the positions (angles) of the relative minimum resolved shear stress respectively appear at 90° intervals.

The relative maximum value and relative minimum value of maximum resolved shear stresses and the positions where to have these values (wafer circumference positions) remain constant irrespective of differences in heat treatment conditions. This applies also to the silicon wafer having crystal orientation <110>, which is mentioned below.

Figure 3:
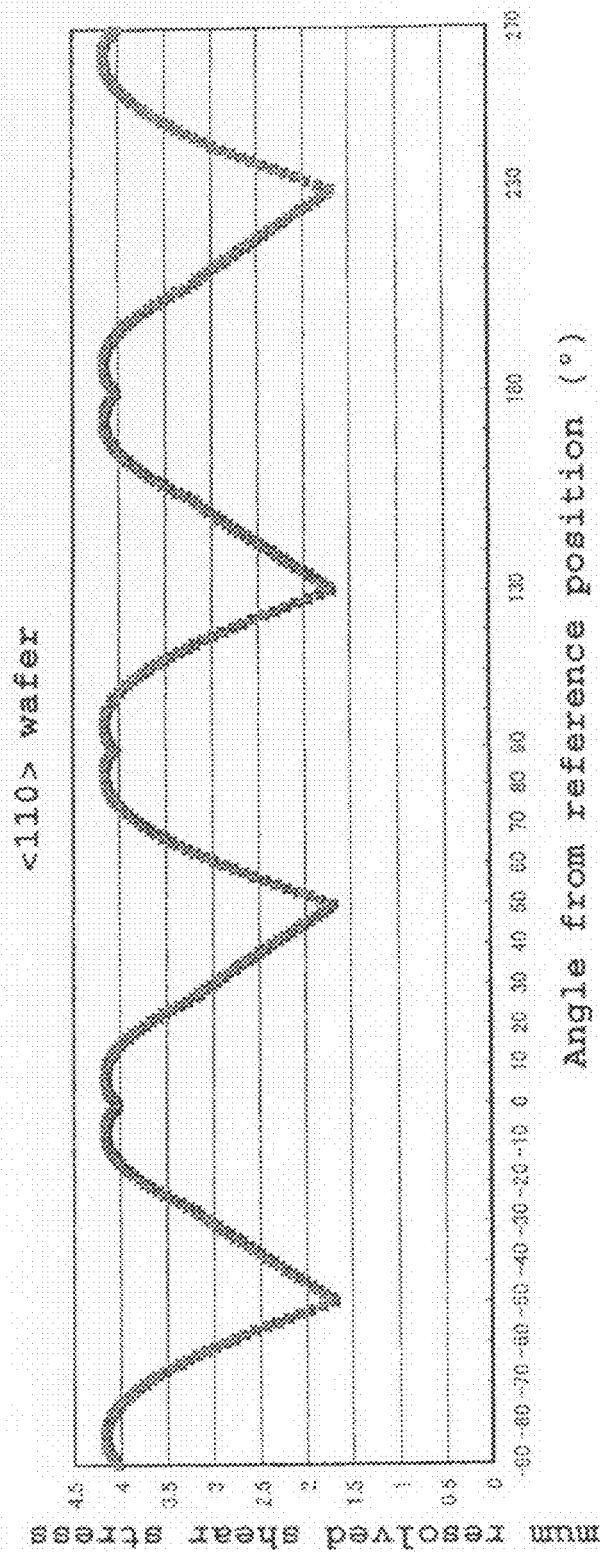
FIG. 3 shows maximum resolved shear stresses in different positions on the wafer circumference for a silicon wafer having a diameter of 300 mm and crystal orientation <110>.

The data shown in FIG. 3 were obtained by calculating the maximum resolved shear stresses in positions on the wafer circumference of a silicon wafer having crystal orientation <110> in the same manner by the finite element method. Each maximum resolved shear stress shown in the figure is the value obtained as a result of combination of several resolved shear stresses respectively acting on the silicon wafer with the crystal orientation <110>, similarly to the case of the wafer with the crystal orientation <100>.

Since the slip systems in this case are different from those in the case of the silicon wafer with the crystal orientation <100>, the maximum resolved shear stress profile is different from the case of the wafer with the crystal orientation <100>. In FIG. 3, the coverage of the abscissa is further extended from 90° to the whole circumference (−90° to 270°).

In FIG. 3, the abscissa denotes the position on the wafer circumference as expressed in terms of angle (°) relative to the reference direction which is defined as being from the center of the wafer toward <100> in parallel to the silicon wafer surface; the position 0° indicates the reference position.

As shown in FIG. 3, the maximum resolved shear stress gets to a relative maximum in the vicinity (within the range of −15° to 15°) of the reference position (0°). In the case of this wafer with the crystal orientation <110>, the maximum resolved shear stress gets to a relative minimum in positions separated by 50° from the reference position (i.e. at −50°, 50°)

and the relative minimum value is a little less than a half of the stress in the vicinity of the reference position.

As is evident from FIG. 3, the positions (angles) where the maximum resolved shear stress gets to a relative maximum appear at intervals of 90° in the case of the wafer with the crystal orientation <110>. On the other hand, as for the positions (angles) where the stress becomes a relative minimum, the first position is at −50°, the second at 50° (hence the interval between the first and the second is 100°), and the third at 130° (hence the interval between the second and the third is 80°). The next (the fourth) is at 230° and, in conclusion, the positions (angles) where the stress becomes a relative minimum periodically appear at irregular 100° or 80° interval alternately.

In the wafer-supporting method of the invention, the silicon wafer back side is supported in a fan-shaped region of wafer surface in the range of 40° to 60° (namely either in the range of −40° to −60° or in the range of 40° to 60°) relative to the reference direction in parallel to the silicon wafer surface, the reference direction being from the center of the silicon wafer toward <100> in the case of the <110> silicon wafer, or the reference direction being from the center of the silicon wafer toward <110> in the case of the <100> wafer, and the objects are to suppress the maximum resolved shear stress, which act on the slip, generated at each wafer-supporting element contact point as low as possible to thereby suppress slip growth and extension by supporting the wafer in positions where the maximum resolved shear stress becomes a relative minimum or close to it.

In the case of a silicon wafer having crystal orientation <100>, a position where the maximum resolved shear stress becomes a relative minimum is at −45° or 45°, so that the position is included within the range specified above (−40° to −60°, or 40° to 60°). Thus, the above-mentioned range of 40° to 60° corresponds to the position where the maximum resolved shear stress becomes a relative minimum or the position where the stress shows a value close to the relative minimum value. Any position in the above-mentioned fan-shaped region of wafer surface is within the range of 40° to 60°.

Therefore, when the wafer is supported in this fan-shaped region thereof, it is possible to suppress the maximum resolved shear stress to a relative minimum value or a value close thereto. The wafer-supporting position may be in any arbitrary location (area) within the above-mentioned fan-shaped region; it is also possible to support the wafer on the whole plane of the fan-shaped region of wafer surface.

Similarly, also in the case of a silicon wafer having crystal orientation <110>, the position (−50°, 50°) where the maximum resolved shear stress becomes a relative minimum are included within the above-specified range (−40° to −60°, 40° to 60°). Thus, this specified range corresponds to the positions where the maximum resolved shear stress becomes a relative minimum or the position where the stress shows a value close to the relative minimum value.

Therefore, in the case of a silicon wafer having crystal orientation <100> or <110>, the maximum resolved shear stress possibly causing the slip can be reduced to a low level by supporting the wafer in a fan-shaped region of wafer surface in the range of 40° to 60° relative to a reference direction in parallel to the silicon wafer surface, the reference direction being from the center of the silicon wafer toward <100> in the case of the <110> wafer and the reference direction being toward <110> in the case of the <100> wafer.

And the reason why in the wafer-supporting method of the invention, in either silicon wafer having crystal orientation <110> or <100>, the other silicon wafer-supporting positions are selected in either wafer surface by rotations of the datum region (first set fan-shaped region of wafer surface mentioned above) by 90° each time is to suppress the maximum resolved shear stress, which acts on the slip, as low as possible to thereby suppress slip growth and extension by supporting the wafer in positions where the maximum resolved shear stress becomes a relative minimum or shows a value close to the relative minimum.

In the silicon wafer with crystal orientation <100>, the range of 40° to 60° broadly designates the range of −40° to −60° or the range of 40° to 60°, and among them, for instance, rotations of the range of 40° to 60°, which lies on the positive direction side relative to the reference position (0°), in the positive direction by 90° each time provides with the range of 130° to 150° and further the range of 220° to 240°. On the other hand, the positions where the maximum resolved shear stress becomes a relative minimum are first 45°, 135° next and 225° further next and these are included in the above-mentioned respective specified ranges (130° to 150°, 220° to 240°).

As regards the silicon wafer with the crystal orientation <110>, positions where the maximum resolved shear stress becomes a relative minimum are first 50°, 130° next and 230° further next, as shown in FIG. 3, and both 130° and 230° are included in the specified ranges (130° to 150°, 220° to 240°) although the angle 130° corresponds to the lower limit to the specified range (130° to 150°). Thus, for both the silicon wafers, whether the crystal orientation is <100> or <110>, those specified ranges corresponds to the respective positions where the maximum resolved shear stress becomes a relative minimum or shows a value close to the relative minimum.

Therefore, when the silicon wafer, whether the crystal orientation is <100> or <110>, is supported in those wafer surface regions resulting from turns, each time by 90°, of the datum fan-shaped region of wafer surface mentioned above, the maximum resolved shear stress, which acts on the slip, can be similarly suppressed to a low level. Each wafer-supporting position may be any arbitrary location (area) in each of those wafer surface regions resulting from the above-mentioned turns by 90° each time; it is also possible to support the wafer on the whole plane of each of such specified regions existing at 90° intervals.

Here, more preferable supporting positions for a silicon wafer having crystal orientation <100> or <110> are shown as follows.

Referring to FIG. 2, more preferable supporting positions for a silicon wafer having crystal orientation <100> are the range of −45°±5° (namely the range of −50° to −40°) or the range of 45°±5° (the range of 40° to 50°) as being datum range, and further, extended ranges resulting from turns of the datum range (45°±5°) in the positive direction by 90° each time, namely the range of 135°±5° (the range of 130° to 140°) and the range of 225°±5° (the range of 220° to 230°).

Thus, more preferable positions for supporting a silicon wafer having crystal orientation <100> lie in "a fan-shaped region of wafer surface in the range of 45°±5° relative to a reference direction in parallel to the silicon wafer surface" (datum region), the reference direction being from the center of the silicon wafer toward <110>, and also lie in those other regions of wafer surface which are determined by rotations of the datum region mentioned above by 90° each time. As mentioned above, the datum range of "45°±5°" can be set either on the positive direction side or on the reverse direction side relative to the reference direction. Also, the above-mentioned 90° turns may be made either in the positive direction or in the reverse direction.

On the other hand, referring to FIG. 3, more preferable positions for supporting a silicon wafer having crystal orientation <110>, when expressed in terms of those angles on a wafer circumference where a maximum resolved shear stress becomes a relative minimum, lie in a fan-shaped region of wafer surface in the range of 50°±5° and in a fan-shaped region wafer surface in the range of 130°±5°, relative to the reference direction in parallel to the silicon wafer surface, the reference direction being from the center of the silicon wafer toward <100> (thus, with the angle 0° as reference point). This is because, in the case of the wafer with crystal orientation <110>, the positions (angles) where the stress becomes a relative minimum appear alternately at irregular 100° and 80° intervals, so that the relative minimum stress position (angle) next to 50°±5° is 130° (50°+80°). The range of "50°±5°" can be on the positive direction side or on the reverse direction side relative to the reference direction/point.

Therefore, more preferable positions for supporting a silicon wafer having crystal orientation <110> are specifically as follows: 50°±5°, –50°±5°, 130°±5° and –130°±5° (the same with 230°±5°) relative to the reference direction/point.

When, in subjecting a silicon wafer having either crystal orientation <100> or <110> to heat treatment, the silicon wafer backside is supported in more preferable supporting positions as above, the wafer is assured to be supported in positions where a maximum resolved shear stress acting on the slip becomes a relative minimum or shows a value close to the relative minimum and, therefore, slip growth and extension can be more effectively suppressed.

Figure 4:
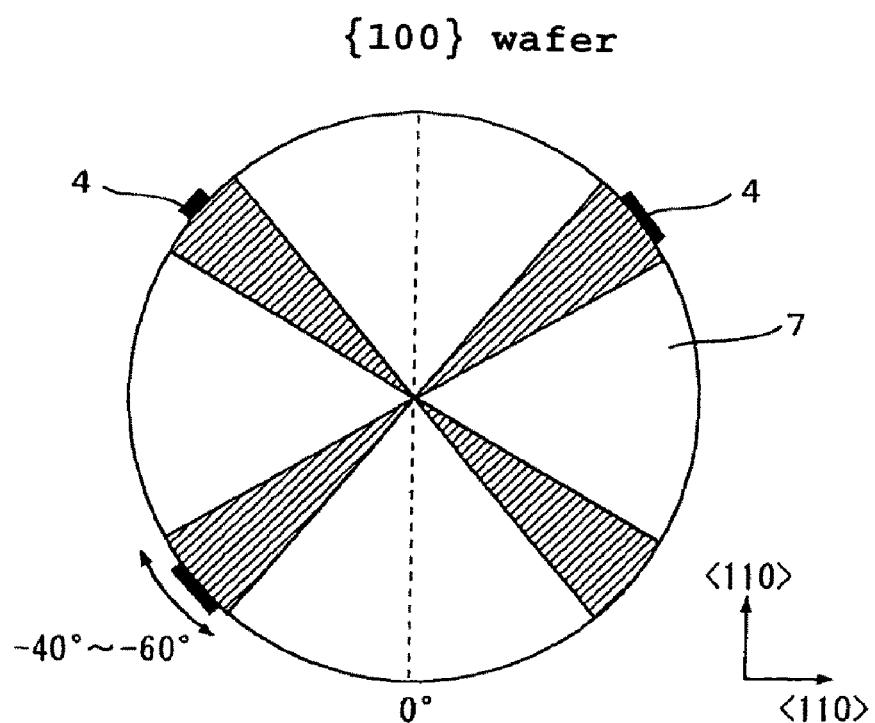
FIG. 4 is an explanatory drawing of an embodiment of the invention and shows an example in which a silicon wafer having crystal orientation <100> is supported at three points.

FIG. 4 is an explanatory illustration of an embodiment of the silicon wafer-supporting method of the invention and shows, by way of example, the case of three-point supporting of a silicon wafer having crystal orientation <100>. The crystal orientation of the target silicon wafer is as shown in the illustration.

The silicon wafer 7 is placed on a set of relevant wafer-supporting elements 4 provided in a row along each column (not shown) of a supporting boat. The ranges shaded (shaded portions) on the surface of the wafer 7 are the supporting position ranges specified herein; there are shown (a) "a fan-shaped region of wafer surface in the range of 40° to 60° relative to a reference direction in parallel to the silicon wafer surface" (datum region), the reference direction being from the center of the silicon wafer toward <110> (shown by a broken line in the illustration) and (b) other regions of wafer surface which are determined by rotations of the datum region by 90° each time.

As shown in FIG. 4, all the three wafer-supporting elements 4 supporting the wafer are disposed within the supporting position ranges (shaded portions) specified herein.

Figure 5:
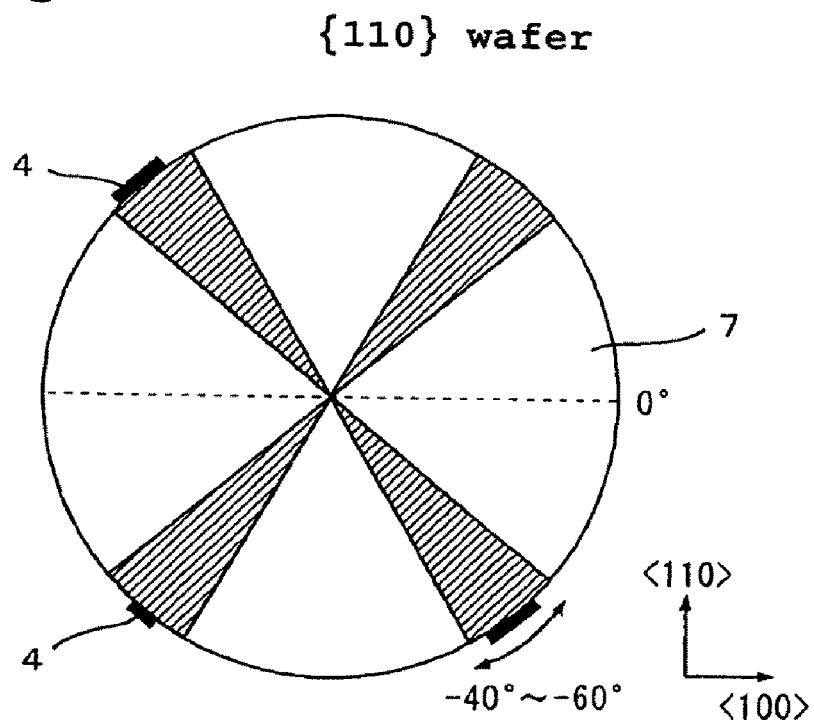
FIG. 5 is an explanatory drawing of an embodiment of the invention and shows an example in which a silicon wafer having crystal orientation <110> is supported at three points.

FIG. 5 is also an explanatory illustration of another embodiment of the silicon wafer-supporting method of the invention and shows the case of three-point supporting of a silicon wafer having crystal orientation <110>. The crystal orientation of the target silicon wafer is as shown in the illustration.

The shaded portions on the surface of the silicon wafer 7 are the supporting position ranges specified herein and, as shown in the illustration, all the three wafer-supporting elements 4 supporting the wafer are disposed within the supporting position ranges specified herein.

The modes of embodiment as shown in FIG. 4 and FIG. 5 are both examples of wafer supporting at three points, and this three-point supporting system is generally employed. However, the supporting method of the invention is not limited to this but use may also be made of a supporting boat of the four-point supporting type.

As explained hereinabove, when the silicon wafer-supporting positions lie (a) in "a fan-shaped region of wafer surface in the range of 40° to 60° relative to a reference direction in parallel to the silicon wafer surface" (datum region), and (b) in other regions of wafer surface which are determined by rotations of the datum region each time by 90°, the reference direction being from the center of the silicon wafer toward <100> in the case of the <110> wafer and the reference direction being from the center of wafer surface toward <110> in the case of the <100> wafer, as specified in the silicon wafer-supporting method of the invention, the resolved shear stresses can be reduced by at most about 50% as compared with the cases in which the supporting positions are outside these ranges. As a result, slip growth and extension can be suppressed and the silicon wafer yield on the occasion of heat treatment can be greatly improved accordingly.

The silicon wafer heat treatment jig of the invention is, as mentioned above, a heat treatment jig which is configured so as to support a silicon wafer having crystal orientation <100> or a silicon wafer having crystal orientation <110> on the back side thereof and comprises a supporting member for supporting the silicon wafer (a) in "a fan-shaped region of wafer surface in the range of 40° to 60° relative to a reference direction in parallel to the silicon wafer surface" (datum region) and (b) in other regions which are determined by turns of the datum region each time by 90°, the reference direction being from the center of wafer surface toward <100> in the case of the <110> wafer and the reference direction being from the center of wafer surface toward <110> in the case of the <100> wafer.

This heat treatment jig can be used as a heat treatment jig for supporting a silicon wafer having either crystal orientation <100> or <110> on the back side thereof in subjecting the silicon wafer not only to heat treatment using a vertical heat treatment boat but also to such treatments as an RTA treatment, a single-feed type epitaxial growth or an SOI heat treatment (lamination treatment).

The term "supporting member" as used herein includes, within the meaning thereof, members for directly contacting and supporting of silicon wafers and ancillary members thereof. For example, in the case of the heat treatment jig (supporting boat 1) for use in a vertical batch-wise heat treatment furnace as shown in FIG. 1, it includes a number of wafer-supporting elements 4 for directly contacting and supporting silicon wafers and columns 3 each provided with said wafer-supporting elements 4 in a row.

The reason why the heat treatment jig of the invention supports a silicon wafer having crystal orientation <100> or <110> (a) in "a fan-shaped region of wafer surface in the range of 40° to 60° relative to a reference direction in parallel to the silicon wafer surface" (datum region) and (b) in other regions of wafer surface which are determined by turns of the datum region by 90° each time, the reference direction being from the center of the wafer toward <100> in the case of the <110> wafer and toward <110> in the case of the <100> wafer (hereinafter all of those wafer surface regions are referred to also as "supporting regions specified herein" or "specified supporting regions" for short) is to suppress a maximum resolved shear stress, which acts on the slip generated at each wafer-supporting element contact point, to a low level to thereby suppress slip growth and extension, as mentioned above. Each wafer-supporting position can be in any arbitrary location or area in each of the supporting regions specified herein; it is also possible to support the wafer on the whole surface of specified supporting regions.

Several modes of embodiment of the heat treatment jig provided with a supporting member enabling such wafer supporting are described below.

In FIG. 4 or FIG. 5, a set of wafer-supporting elements 4 supporting the silicon wafer 7 supports the wafer in the supporting regions specified herein as shaded and constitute a supporting member of the heat treatment jig of the invention. In this case, the three-point supporting system for supporting the wafer at three supporting elements in the same plane is employed.

Figure 6:
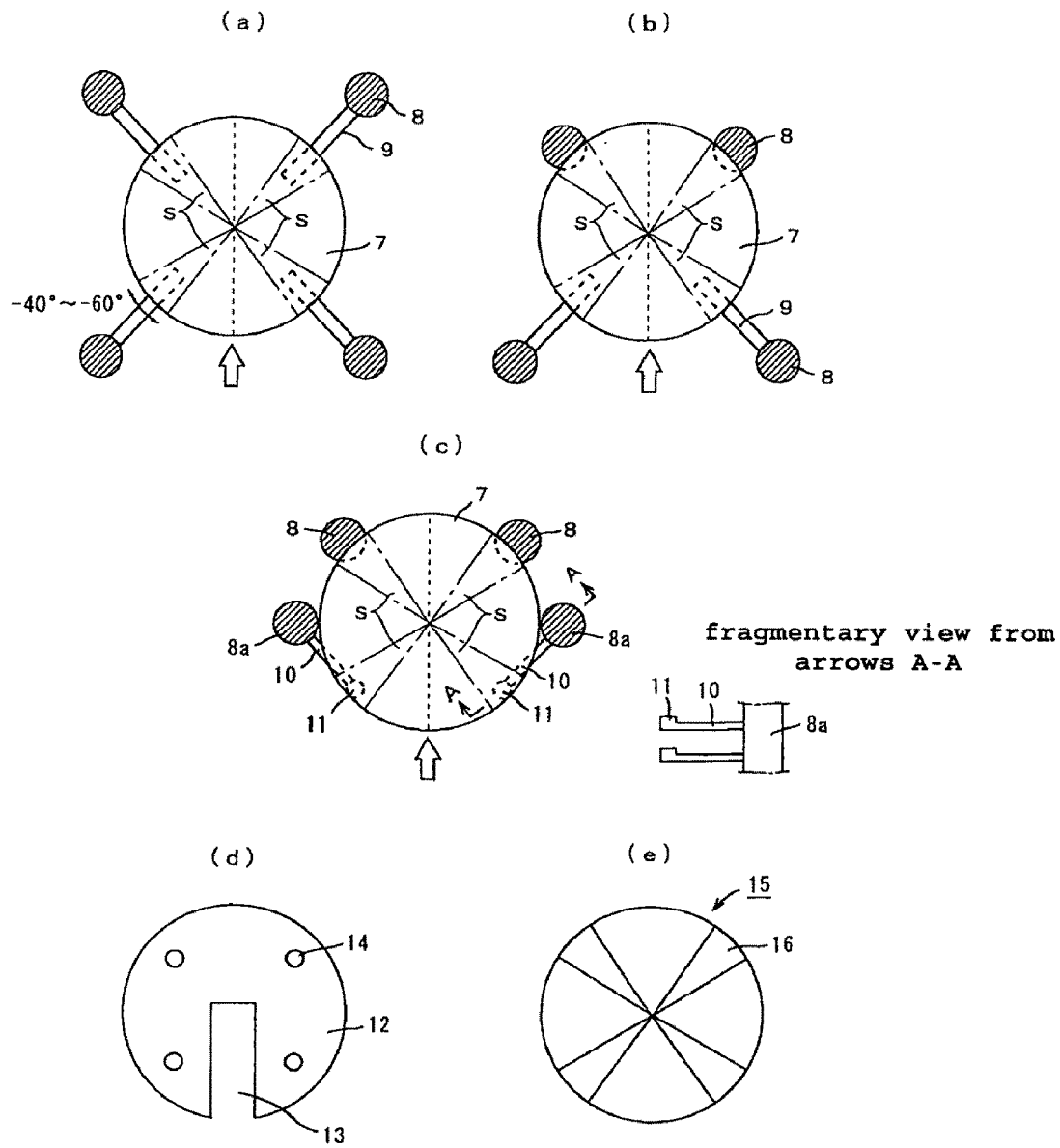
FIG. 6 is a schematic representation of main parts of a supporting member in a four-point support heat treatment jig for use in a vertical heat treatment furnace.

FIG. 6 is a schematic representation of the main parts of a supporting member with a four-point support type for a heat treatment jig for use in a vertical heat treatment furnace. Although the heat treatment jig is the one that has a multistage structure capable of multistage-wise accommodating a number of wafers, each being horizontally positioned, FIG. 6 just shows a plan view of an arbitrary stage of the jig. FIGS. 6(a) to 6(c) show how a silicon wafer is supported in the specified supporting regions. FIGS. 6(d) and 6(e) each shows a supporting member (supporting disk) capable of supporting a wafer in the specified supporting regions.

A heat treatment jig to be used in a vertical heat treatment furnace is required to be provided with at least one opening through which silicon wafers can be inserted into the heat treatment jig, irrespective of whether it is of the three-point or four-point supporting type. Such consideration has been given to all the heat treatment jigs shown in FIGS. 6(a) to 6(d).

In the heat treatment jig shown in FIG. 6(a), the supporting member is constituted of four columns 8 and four extended arms 9 respectively fixed to the columns 8.

The silicon wafer 7 is inserted into the heat treatment jig in the direction indicated by an outlined arrow in the figure, and directly contacted and supported by the four extended arms 9. The fan-shaped regions shown by dashed-dotted, designated by the symbol S on the surface 7 of the silicon wafer, comprise (a) "a fan-shaped region of wafer surface in the range of 40° to 60° or its mirror-image region (namely, the range of −40° to −60° or the range of 40° to 60°) relative to a reference direction in parallel to the silicon wafer surface" (datum region) and (b) other region which is determined by rotation of the datum region by 90° (specifically, the fan-shaped region in the range of −130° to −150° or in the range of 130° to 150°), the reference direction being from the center of the silicon wafer 7 toward <100> in the case of a <110> wafer and toward <110> in the case of a <100> wafer (in either case, the reference direction is shown by a broken line). As shown, the silicon wafer 7 is supported in these specified supporting regions, so that maximum resolved shear stress, which acts on the slip, is suppressed to a low level and slip extension is suppressed.

In the heat treatment jig shown in FIG. 6(b), the supporting member includes four columns 8 and two extended arms 9 as fixed to two columns 8 among the four columns. The other two columns 8 with no extended arm 9 are provided with grooves for supporting wafers (column grooves).

The silicon wafer 7 inserted into the heat treatment jig is supported, in the specified supporting regions indicated by the symbol S, by the two extended arms 9 and the column grooves respectively provided in the columns 8, as shown in the figure. By using such a heat treatment jig comprising the supporting member thus configured, it becomes possible to suppress maximum resolved shear stress, which acts on the slip, to a low level and suppress slip extension and, further, somewhat simplify the heat treatment jig and reduce the size thereof.

In the heat treatment jig shown in FIG. 6(c), the supporting member includes four columns 8, 8a (two columns 8 out of them being provided with column grooves) and two extended arms 10, similarly to the heat treatment jig shown in FIG. 6(b); the two columns 8a with the extended arms 10 fixed thereto are, however, differently arranged. Thus, the two columns 8a are disposed so as to be positioned on opposite sides of the wafer 7, and each arm 10 extends toward a wafer insertion opening. Furthermore, as shown in the A-A arrow view, a cylindrical protrusion 11 for supporting the wafer back side is formed on the tip of each extended arm 10.

The silicon wafer 7 inserted into the heat treatment jig is supported, as shown in the figure, by column grooves formed on the two columns 8 and protrusions 11, each formed on the tip of the extended arm 10, in the specified supporting regions indicated by the symbol S. The protrusions 11 are formed so that the extended arms 10 may not come into contact with the silicon wafer 7 at areas other than the specified supporting regions.

When a heat treatment jig comprising the thus-configured supporting member is used, it is possible to suppress slip extension, facilitate the insertion of silicon wafers into the heat treatment jig and reduce the size of the heat treatment jig.

The supporting member shown in FIG. 6(d) is a supporting disk 12. At four sites on the surface of this supporting disk 12, there are formed cylindrical protrusions 14 capable of supporting a wafer in the supporting regions specified herein. Further, the supporting disk 12 has an open slot 13 formed so as to permit forward and backward movements of a wafer transfer arm carrying the silicon wafer. For holding this supporting disk 12, the method comprising providing the columns with grooves and inserting the supporting disk 12 into the grooves for holding it can be applied, for example.

The silicon wafer (not shown) inserted into the heat treatment jig comprising such supporting member is supported by the cylindrical protrusions 14 formed on the supporting disk 12 in the specified supporting regions, so that the slip extension which tends to occur on the wafer on the occasion of heat treatment can be suppressed.

The supporting member shown in FIG. 6(e) is also a supporting disk 15 and, on the surface thereof, there are formed elevated supporting parts 16 completely matching the configuration of the whole wafer-supporting regions specified herein.

When a heat treatment jig comprising such supporting member is used, the thermal stress acting on the silicon wafer is dispersed, so that the slip suppressing effect is improved. Further, when it is used as a susceptor in epitaxial growth, a space is partially formed between the wafer back and the susceptor, so that the effect of discharging the gas otherwise retained on the wafer back side is enhanced and a preventive effect on the phenomenon of autodoping can also be expected.

Desirable as materials for the supporting member are quartz, single crystal silicon, polycrystalline silicon, silicon carbide and silicon-impregnated silicon carbide, among others. The material and shape, among others, of the supporting member can be properly selected according to the thermal environment in the relevant step.

The heat-treated wafer of the invention is, as mentioned above, a silicon wafer having crystal orientation <100> or <110> as subjected to heat treatment in a state supported (a) in "a fan-shaped region of wafer surface in the range of 40° to 60° relative to a reference direction in parallel to the silicon wafer surface" (datum region) and (b) in other regions of wafer surface which are determined by rotations of the datum region by 90° each time, the reference direction being from the center of the silicon wafer toward <100> in the case of the <110> wafer and toward <110> in the case of the <100> wafer.

The term "heat treatment" as used herein refers to heat treatment using a vertical heat treatment boat, RTA treatment, single-feed type epitaxial growth, SOI heat treatment or the like.

The heat-treated wafer of the invention does not show any difference in appearance from the silicon wafers supported and heat-treated by the conventional methods. However, the heat-treated wafer of the invention, which is one supported in the specified supporting regions and subjected to heat treatment, as mentioned above, shows suppressed slip growth and extension as a result of suppression of maximum resolved shear stress acting on the slip formed at the point of contact between the wafer and each supporting position during heat treatment to a low level.

Therefore, as compared with the silicon wafers supported by the conventional methods and subjected to heat treatment, the heat-treated wafer of the invention is characterized in that it has few slip and, in particular, has no long and large slip. Therefore, the use of this heat-treated wafer is advantageous in that the yield in device fabrication can be improved.

EXAMPLES

Example 1

FIG. 7 shows locations where each silicon wafer was provided with slip initiating points in the examples of the present invention. In Example 1, as shown in FIG. 7(a), silicon wafers having a diameter of 200 mm and crystal orientation <100> were provided with slip initiating points at the location "a" (indicated by a1 in the figure) in the vicinity of the reference position (0°) and at the location (indicated by a2) away from the location "a" by 90° (case 1).

Alternatively, the same silicon wafers as mentioned above were provided with slip initiating points at the location "b" (indicated by b1) away from the reference position (0°) by 45° in a circumferential direction and at the location (indicated by b2) away from the location "b" (case 2) by 90°. The locations (b1, b2) where slip initiating points are given in case 2 fall within the wafer-supporting regions specified herein. Each slip initiating point was provided by giving an indentation to the outermost peripheral wafer surface using a Vickers hardness tester under a load of 1 kg weight.

These silicon wafers were subjected to heat treatment, and then, for each wafer, the lengths of the slips generated and grown initiating from the point "a" and the point separated by 90° from the point "a" were measured and the maximum value was determined. Likewise, the lengths of slips generated and grown initiating from the point "b" and the point separated by 90° from the point "b" were measured and the maximum value was determined for each wafer.

The means of maximal slip lengths in case 1 and case 2 are shown in Table 1.

TABLE 1

| Case | Position of slip initiating point | Slip length (mean) |
|---|---|---|
| 1 | Point "a" and point separated by 90° from point "a" | 12 mm |
| 2 | Point "b" and point separated by 90° from point "b" | 6 mm |
| 3 | Point "c" and point separated by 90° from point "c" | 12 mm |
| 4 | Point "d" and point separated by 90° from point "d" | 6 mm |

While the mean slip length in case 1 was 12 mm, the mean slip length in case 2 was 6 mm, indicating that, in case 2 in which the slip initiating points were provided in the wafer-supporting regions specified herein, the slip length could be reduced to half in case 1. This is presumably because, in case 2, maximum resolved shear stress was suppressed to a low level, as mentioned above, hence slip growth was suppressed.

Example 2

In Example 2, silicon wafers having a diameter of 200 mm and crystal orientation <110> as shown in FIG. 7(b) were provided with slip initiating points at the point "c" (indicated by c1 in the figure) in the vicinity of the reference position (0°) and at the point (indicated by c2) separated by 90° from the point "c" (case 3), like in Example 1.

Alternatively, the same silicon wafers as mentioned above were provided with slip initiating points at the point "d" (indicated by d1) separated by 45° in the circumferential direction from the reference position (0°) and at the point (indicated by d2) separated by 90° from the point "d" (case 4). The positions (d1, d2) given slip initiating points in case 4 fall within the wafer-supporting regions specified herein.

The measurement results are shown also in Table 1.

While the mean slip length in case 3 was 12 mm, the mean slip length in case 4 was 6 mm. It is thus presumable that when slip initiating points were provided in the wafer-supporting regions specified herein, slip growth could be suppressed also in silicon wafers having crystal orientation <110>.

INDUSTRIAL APPLICABILITY

The silicon wafer-supporting method of the invention is a method consisting in specifying the wafer-supporting regions on the occasion of heat treatment in a vertical heat treatment furnace. In silicon wafers having crystal orientation <100> or <110>, this method can reduce the shear stress, which contributes to the extension of the slip generated at each wafer-supporting element contact point as an initiation, suppress slip growth and markedly improve the yield of heat-treated wafers. This supporting method can be carried out with ease using the silicon wafer heat treatment jig of the invention.

The silicon wafer obtained by using the supporting method and the heat treatment jig has few slip, in particular has no long and large slip, and is high in quality.

Therefore, the silicon wafer-supporting method, heat treatment jig and heat-treated wafer of the invention can be widely utilized in the production of silicon wafers having crystal orientation <100> or <110> and of devices derived therefrom.

What is claimed is:

1. A method of supporting a silicon wafer having crystal orientation <100> or a silicon wafer having crystal orientation <110> for heat treatment thereof using a wafer boat, wherein:

(i) in the case of the <110> wafer, a back side of the silicon wafer is supported by the wafer boat (a) in a datum region comprising a fan-shaped region of a surface of the silicon wafer in a range of 40° to 60° relative to a reference direction in parallel to the silicon wafer surface, the reference direction being from the center of the silicon wafer toward <100> and (b) in at least one other region which is distanced from the datum region by one or more 90° increments; and (ii) in the case of the <100> wafer, a back side of the silicon wafer is supported by the wafer boat (a) in a datum region comprising a fan-shaped region of the silicon wafer surface in the range of 40° to 60° relative to a reference direction, the reference direction being toward <110> and
(b) in at least one other region regions which is distanced from the datum region by one or more 90° increments.

2. A method of supporting a silicon wafer having crystal orientation <110> for heat treatment thereof using a wafer boat, comprising the step of supporting a back side of the silicon wafer by the wafer boat in a datum region comprising a fan-shaped region of a surface of the silicon wafer in a range of 50±5°, 130±5°, −130±5°, −50±5°, relative to a reference direction, the reference direction being toward <100>.

* * * * *